United States Patent

Pandumsoporn et al.

[11] Patent Number: 6,132,575
[45] Date of Patent: Oct. 17, 2000

[54] MAGNETRON REACTOR FOR PROVIDING A HIGH DENSITY, INDUCTIVELY COUPLED PLASMA SOURCE FOR SPUTTERING METAL AND DIELECTRIC FILMS

[75] Inventors: Tamarak Pandumsoporn, Fremont; Mark Feldman, Castro Valley, both of Calif.

[73] Assignee: Alcatel, Paris, France

[21] Appl. No.: 09/162,646

[22] Filed: Sep. 28, 1998

[51] Int. Cl.[7] .............................. C23C 14/35; C23C 14/34
[52] U.S. Cl. .............................. 204/298.06; 204/298.08; 204/298.23; 204/298.22; 204/298.2
[58] Field of Search .................... 204/298.06, 298.08, 204/298.09, 298.15, 298.17, 298.2, 298.22, 298.23

[56] References Cited

U.S. PATENT DOCUMENTS

| | | | |
|---|---|---|---|
| 4,990,229 | 2/1991 | Campbell et al. | 204/298.06 |
| 5,006,395 | 4/1991 | Hori et al. | 428/141 |
| 5,122,251 | 6/1992 | Campbell et al. | 204/298.06 |
| 5,178,739 | 1/1993 | Barnes et al. | 204/192.12 |
| 5,427,670 | 6/1995 | Baggerman et al. | 204/298.09 |
| 5,431,799 | 7/1995 | Mosely et al. | 204/298.06 |
| 5,589,041 | 12/1996 | Lantsman | 204/192.33 |
| 5,593,551 | 1/1997 | Lai | 204/192.12 |
| 5,630,917 | 5/1997 | Guo | 204/192.12 |
| 5,656,123 | 8/1997 | Salimian et al. | 156/345 |
| 5,683,537 | 11/1997 | Ishii | 156/345 |
| 5,683,539 | 11/1997 | Qian et al. | 156/345 |
| 5,685,941 | 11/1997 | Forster et al. | 156/345 |
| 5,688,357 | 11/1997 | Hanawa | 156/345 |
| 5,688,382 | 11/1997 | Besen et al. | 204/192.12 |
| 5,698,036 | 12/1997 | Ishii et al. | 118/723 MW |
| 5,725,740 | 3/1998 | Raaijmakers | 204/192.12 |
| 5,730,803 | 3/1998 | Steger et al. | 118/723 R |
| 5,795,451 | 8/1998 | Tan et al. | 204/298.2 |
| 5,810,982 | 9/1998 | Sellers | 204/298.08 |
| 5,935,373 | 8/1999 | Koshimizu | 156/345 |

OTHER PUBLICATIONS

Aluminum Thin Films and Physical Vapor Deposition in VLSI, *Silicon Processing for the VLSI Era*, pp. 330–375.

*Primary Examiner*—Nam Nguyen
*Assistant Examiner*—Steven H. VerSteeg

[57] ABSTRACT

A magnetron reactor for providing a high density of plasma is disclosed. The reactor comprises a plasma reactor chamber that is adapted for receiving a processing gas in the chamber and is further adapted for connection to an evacuation source. A direct current driven magnetron is positioned within the reactor chamber and is adapted to hold a sputtering target. A movable substrate supporting pedestal, adapted to hold a substrate, is positioned within the reactor and is movable so as to place the substrate sufficiently proximate to the sputtering target to enable deposition of sputter products thereon. The substrate pedestal is connected to a first radio frequency signal source through an impedence matchbox having a phase shifting adjustment means. To provide a high density inductively coupled plasma, a radio frequency antenna, having a substrate end, is positioned about the chamber. The antenna is connected to a second radio frequency signal source through an impedence matchbox. The reactor of the present invention also includes an electromagnetic coil that is positioned around and adjacent to the substrate end of the radio frequency antenna.

10 Claims, 2 Drawing Sheets

MAGNETRON REACTOR FOR PROVIDING A HIGH DENSITY, INDUCTIVELY COUPLED PLASMA SOURCE FOR SPUTTERING METAL AND DIELECTRIC FILMS

BACKGROUND OF THE INVENTION

1. Field of the Invention

The present invention relates to plasma processing of a substrate. More particularly, the present invention relates to a reactor apparatus for providing a high density plasma source for sputtering metal and dielectric films onto a substrate.

2. Description of the Prior Art

Magnetron sputtering is a known method of physical vapor deposition (PVD) for forming thin films on substrates of a variety of types. Magnetron sputtering is generally accomplished by creating a plasma within a vacuum chamber adjacent to the surface of a sputter target. The plasma is formed in a support gas introduced into the chamber at a very low pressure. A reactive gas may also be introduced into the chamber. An electrical potential is created within the vacuum chamber between the sputter target that is usually cathodic and an anode. The electric field generated by the potential causes the support gas to be ionized, thereby forming the plasma. A magnetic field is also provided to confine the plasma discharge. The magnetic field traps electrons so as to increase the number of collisions between the electrons and the support gas atoms. This, in turn, increases the ion population and intensifies the plasma.

Magnetron sputtering has become widely used in the semiconductor industry to deposit metallization layers in semiconductor devices. Because the dimensions of semiconductor devices have been reduced substantially over the years and the size of semiconductor wafers used to make such semiconductor devices has increased during the same period, the demands for precision sputtering have increased. Precision sputtering requires the generation and control of a high density plasma.

SUMMARY OF THE INVENTION

It is an object of the present invention to provide an apparatus for generating and controlling a high density plasma within a plasma chamber for sputtering metal and dielectric films.

This object is accomplished, at least in part, by a plasma reactor for sputtering metal and dielectric materials. The reactor comprises a plasma reactor chamber that is adapted for receiving a processing gas in the chamber and is further adapted for connection to an evacuation source. A direct current driven magnetron is positioned within the reactor chamber. The magnetron is adapted to hold a sputtering target. A direct current (DC) power source is connected to the magnetron. A movable substrate supporting pedestal, adapted to hold a substrate, is positioned within the reactor and is movable so as to place the substrate sufficiently proximate to the sputtering target to enable deposition of sputter products. The substrate pedestal is connected to a first radio frequency signal source through an impedence matchbox having a phase shifting adjustment means. To provide a high density inductively coupled plasma, a radio frequency antenna, having a substrate end, is positioned about the chamber. The antenna is connected to a second radio frequency signal source through an impedence matchbox. The reactor of the present invention also includes an electromagnetic coil that is positioned around and adjacent to the substrate end of the radio frequency antenna. The coil is connected to a DC power supply.

Other objects and advantages of the present invention will become apparent to those skilled in the art from the following detailed description read in conjunction with the attached drawing and claims appended hereto.

DETAILED DESCRIPTION OF THE PRESENT INVENTION

Figure 1:
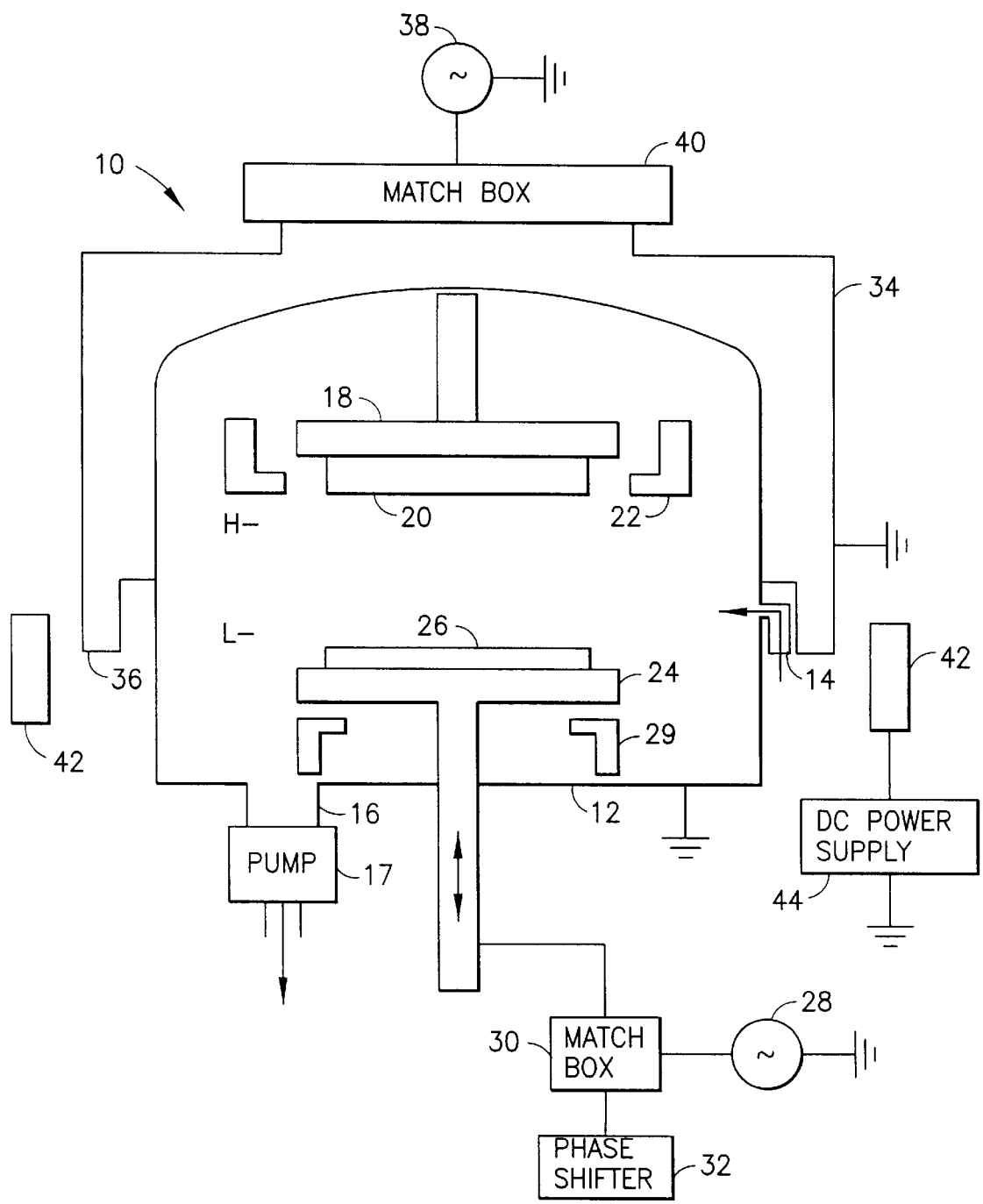
FIG. 1 is a schematic diagrams illustrating the reactor apparatus embodying the present invention.

Referring to FIG. 1, according to the present invention, a plasma reactor 10 for providing a high density plasma, on the order of about $10^{12}$ ions per $cm^2$, for sputtering metal and dielectric films onto a substrate, includes a plasma reactor chamber 12 that is fitted with a gas inlet 14 for receiving a processing gas into the chamber 12. The type of processing gas used in the plasma reactor of the present invention will vary according to the type of processing to be performed by the plasma reactor. For example, argon may be used for metal sputtering while oxygen or nitrogen may be used for reactive dielectric sputtering. As explained further below, the processing gas introduced into the reactive chamber may be ionized into three plasma regions in the chamber 12 (FIG. 2, $P_1$, $P_2$ and $P_3$) by the reactor 10. In addition to the gas inlet 14, the chamber 12 is further provided with a outlet conduit 16 for connecting the chamber to an evacuation source, such as vacuum pump 17. The evacuation source should be sufficient to enable a very low operating pressure in the chamber in the range of about 1 to 50 mTorr, which is usually sufficient for maintenance of a high density plasma on the order of about $10^{12}$ ions per $cm^2$.

The reactor further includes a magnetron 18 positioned within the reactor chamber 12 near its top end. The magnetron 18 is conventionally adapted to hold a sputtering target 20 adjacent thereto and is connected to a DC signal source (not shown) that may be continuous or pulsing. The material forming the target 20 may be selected from any type of metal typically used for sputtering including aluminum, copper, tantalum, titanium or tungsten, for example. A ground shield 22 is positioned within the chamber around the magnetron 18 and the sputtering target 20. The magnetron 18 may either be a static planar magnetron or a rotating magnetron, as required.

A movable substrate pedestal 24, having a means, such as clamps, for holding a substrate 26, is positioned within the reactor chamber 12 near its bottom end. The pedestal is continuously movable between a bottom or low position L and a top or high position H so that the substrate 26 held thereby can be positioned sufficiently proximate to the sputtering target 20 to obtain a suitable target-to-substrate distance to enable deposition of sputter products onto the substrate 26. Those skilled in the art will appreciate that the target-to-substrate distance is typically chosen on the basis of the particular plasma processing conditions, such as pressure, target material and type of magnetron, used for the sputter deposition process. A ground shield 29 may be provided below the substrate 26 held by pedestal 24.

In addition to being continuously movable between low and high positions, the pedestal 24 is connected to a first radio frequency (RF) signal source 28 through a an impedance matchbox 30. The impedance matchbox 30 is further provided with a phase shifter 32. The phase shifter 32 permits regulation of the phase angle of the first radio frequency signal from the source 28 relative to a second radio frequency signal. Preferably, the first radio frequency signal source 28 is capable of providing a radio frequency signal at about 13.56 MHz. If desired, the pedestal 24 may be configured to control the temperature of the substrate 26 by providing passages (not shown) in the pedestal for flowing a fluid, such as water, or a gas, such as helium.

To obtain an inductively coupled plasma source within the chamber 12, the reactor 10 of the present invention is further fitted with a radio frequency antenna 34 positioned about the chamber 12. The antenna 34 can be temperature controlled by a flow of liquid, such as water or other suitable cooling medium, through provided cooling passages (not shown). The antenna 34 has a substrate end 36 and is connected to a second radio frequency signal source 38, preferably through an impedance matchbox 40. Like the first radio frequency signal source 28, the second radio frequency signal source 38 is also capable of providing a radio frequency signal at about 13.56 MHz. The substrate end 36 of the antenna 34 is preferably positioned to be approximately just above the top limit of the range of motion of the pedestal 26.

According to the present invention, an electromagnetic coil 42 is disposed around the antenna 34 adjacent to its substrate end 36. The coil 42 is connected to a DC power supply source 44 and is configured through an appropriate number of turns of the coil and by the DC power supplied thereto, to provide a desired magnetic field inside the reactor chamber. The electromagnetic coil may also be temperature controlled by flowing gas or liquid. Those skilled in the art will appreciate that the magnetic field created by the coil 42 is controllable by varying the DC power from power supply source 44.

Figure 2:
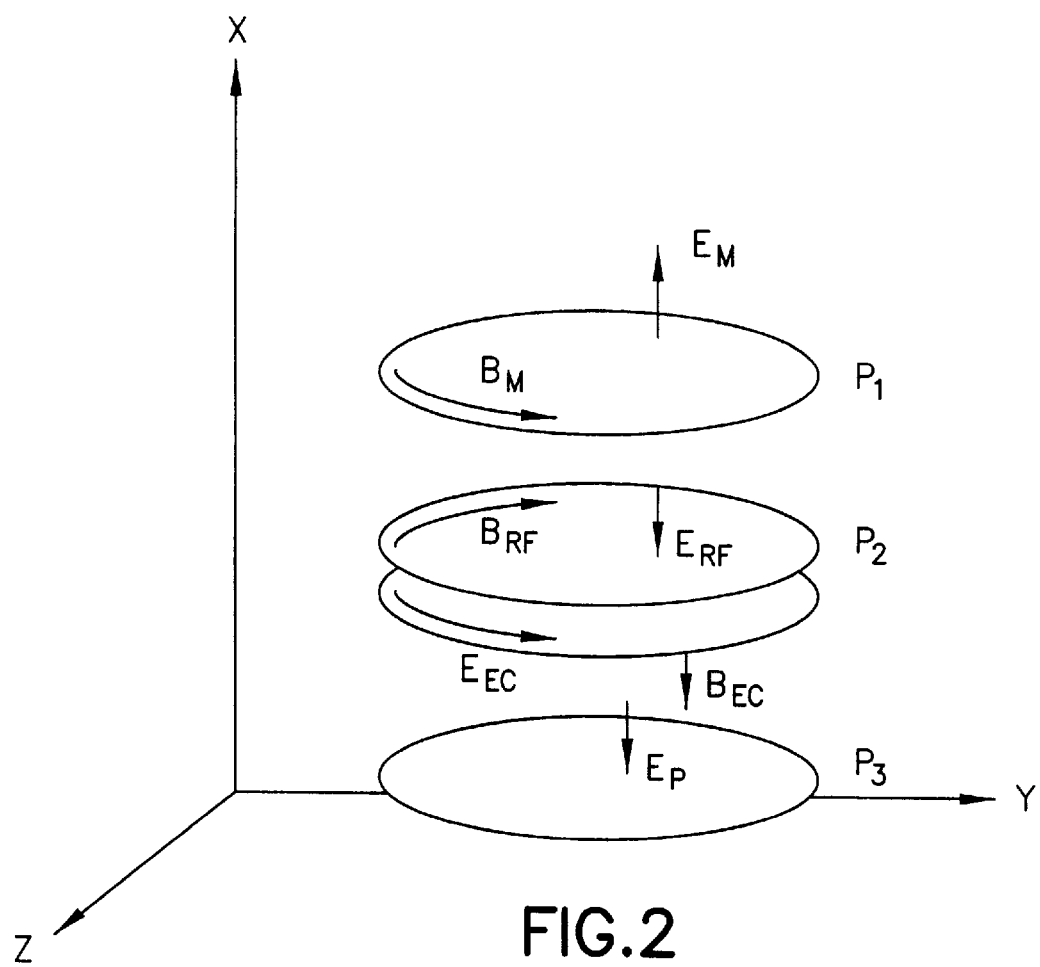
FIG. 2 is an orthogonal graphic illustration of the electrical and magnetic fields for the high density plasmas generated by the apparatus of the present invention.

Referring to FIG. 2, under one set of operating conditions, the reactor of the present invention can provide up to three plasma regions $P_1$, $P_2$ and $P_3$. The first plasma region $P_1$ is created adjacent to the magnetron and is influenced by the magnetic field $B_M$ and electrical field $E_M$. The second plasma $P_2$ is the inductively coupled high density plasma generated just above the substrate 26. The inductively coupled high density plasma is influenced by the magnetic field $B_{RF}$ of the radio frequency antenna and the magnetic field $B_{EC}$ of the electromagnetic coil as well as the electrical fields $E_{RF}$ and $E_{EC}$. The high density inductively coupled plasma in region $P_2$ allows reactant species to flow more uniformly across the substrate 26. The electromagnetic fields are used to control the plasma density as well as provide directionality to the species depositing on the substrate 26. The ionization of the inductively coupled plasma is more efficient because it reduces energy losses to the reactor chamber wall. Also, by cooling the antenna and providing the magnetic and electrical fields of the electromagnetic coil, the electron temperature can be increased which raises the density of electrons. This, in turn, increases the rate of ionization of the metal sputtered neutrals. The third plasma $P_3$ region is provided adjacent to the substrate 26. The third plasma $P_3$ is influenced by substrate biasing $E_P$ caused by phase shifting, the signal from the first radio frequency relative to the signal from the second radio frequency source. Metal can be deposited with control by substrate biasing.

The reactor of the present invention can be used to deposit metal layers for a variety of purposes. For example, metal layers may be deposited for interconnections or barrier layers in integrated circuit wafer fabrication. The reactor may also be used to provide metal layers for interconnections, coils, poles and shields for inductive, magnetoresistive and giant magnetoresistive heads in the thin film head industry.

The reactor of the present invention may also be used to deposit dielectric films, such as $Al_2O_3$, AlN, $Al_2O_xN_y$, TaN, WN, and TiN, for example, by way of reactive sputtering with a reactive gas such as nitrogen or oxygen. TaN and TiN materials are used in conjunction with metal layers in semiconductors and thin film head industries for diffusion, barrier and anti-refractive layers. Dielectric films suitable for the optical coating industry can also be provided with the reactor of the present invention.

It will thus be seen that the objects and advantages set forth above and those made apparent from the preceding descriptions, are efficiently attained and, since certain changes may be made in the above construction without departing from the scope of the invention, it is intended that the matter contained in the above description or shown in the accompanying drawings shall be interpreted as illustrative and not in a limiting sense. It is also to be understood that the following claims are intended to cover all of the generic and specific features of the invention herein described, and all statements of the scope of the invention which, as a matter of language, might be said to fall therebetween.

What is claimed is:

1. A plasma reactor for sputtering metals and dielectric films, the reactor comprising:

a plasma reactor chamber adapted for receiving a processing gas in the chamber and adapted for connection to an evacuation source;

a direct current (DC) driven magnetron positioned within the reactor chamber, the magnetron being adapted to hold a sputtering target;

a DC signal source connected to the magnetron;

a movable substrate supporting pedestal adapted to hold a substrate, positioned within the reactor chamber and movable so as to place the substrate sufficiently proximate to the sputtering target to enable deposition of sputter products onto the substrate;

a first radio frequency signal source connected to the substrate pedestal via a first radio frequency match box having a phase shifting adjustment means;

a radio frequency antenna positioned about the chamber, the antenna having a substrate end;

a second radio frequency signal source connected to the radio frequency antenna via a second radio frequency match box;

an electromagnetic coil disposed around the antenna adjacent to its substrate end; and a DC power supply connected to the electromagnetic coil.

2. The reactor according to claim 1, wherein the DC signal source connected to the magnetron is a pulsing DC signal source.

3. The reactor according to claim 1, wherein the DC signal source connected to the magnetron is a continuous DC signal source.

4. The reactor according to claim 1, wherein the substrate pedestal is cooled.

5. The reactor according to claim 1, wherein the antenna is cooled.

6. The reactor according to claim 5, wherein the electromagnetic coil is cooled.

7. The reactor according to claim 6, wherein the pedestal is cooled.

8. The reactor according to claim 1, wherein the electromagnetic coil is cooled.

9. The reactor according to claim 1, wherein the magnetron is a rotating magnetron.

10. The reactor according to claim 1, wherein the magnetron is a rotating magnetron and the DC signal source connected to the magnetron is a pulsing DC signal source.

* * * * *

UNITED STATES PATENT AND TRADEMARK OFFICE
CERTIFICATE OF CORRECTION

PATENT NO. : 6,132,575
DATED : October 17, 2000
INVENTOR(S) : Pandhumsoporn et al.
MAGNETRON REACTOR FOR PROVIDING A HIGH...

It is certified that error appears in the above-identified patent and that said Letters Patent is hereby corrected as shown below:

ON THE TITLE PAGE
Item [75] Inventor's name, "Pandumsoporn et al." should be --Pandhumsoporn et al.--.

Inventor's name, "Pandumsoporn et al." should be --Pandhumsoporn et al.--.

Signed and Sealed this

Eighth Day of May, 2001

Attest:

NICHOLAS P. GODICI

Attesting Officer

Acting Director of the United States Patent and Trademark Office